US006867665B2

(12) United States Patent
Manku et al.

(10) Patent No.: US 6,867,665 B2
(45) Date of Patent: Mar. 15, 2005

(54) FILTERS IMPLEMENTED IN INTEGRATED CIRCUITS

(75) Inventors: Tajinder Manku, Kitchener (CA); Bish Ray, Kanata (CA)

(73) Assignee: Sirific Wireless Corporation, Waterloo (CA)

(*) Notice: Subject to any disclaimer, the term of this patent is extended or adjusted under 35 U.S.C. 154(b) by 0 days.

(21) Appl. No.: 09/934,339

(22) Filed: Aug. 21, 2001

(65) Prior Publication Data

US 2002/0047757 A1 Apr. 25, 2002

Related U.S. Application Data

(60) Provisional application No. 60/226,754, filed on Aug. 21, 2000.

(51) Int. Cl.[7] .................................................. H03H 7/00
(52) U.S. Cl. ......................... 333/171; 333/172; 333/176
(58) Field of Search ................................. 333/170, 171, 333/172, 174–176

(56) References Cited

U.S. PATENT DOCUMENTS

| | | | | |
|---|---|---|---|---|
| 2,093,665 A | * | 9/1937 | Tellegen ..................... 333/170 |
| 2,207,796 A | * | 7/1940 | Grundmann ................ 333/171 |
| 2,606,966 A | * | 8/1952 | Pawley ...................... 333/170 |
| 3,325,753 A | * | 6/1967 | Shearer et al. ............. 333/170 |
| 3,898,375 A | * | 8/1975 | Hannan et al. ............. 380/208 |
| 5,105,172 A | * | 4/1992 | Khatibzadeh et al. ....... 333/175 |
| 5,121,078 A | * | 6/1992 | Havot et al. ................ 333/170 |
| 5,202,651 A | | 4/1993 | Yoshimasu ................. 333/170 |
| 5,635,892 A | * | 6/1997 | Ashby et al. ............... 336/200 |
| 5,697,087 A | | 12/1997 | Miya et al. ................. 455/307 |
| 5,918,167 A | | 6/1999 | Tiller et al. ................ 455/310 |
| 6,606,012 B2 | * | 8/2003 | Novak ....................... 333/17.3 |

FOREIGN PATENT DOCUMENTS

GB         0841560     *  7/1960   ................. 333/170

OTHER PUBLICATIONS

Millman, Microelectronics: Digital and Analog Circuits and Systems, McGraw–Hill Book Co., p. xxii, 1979.*
M.A. Copeland et al., "5–GHz SiGe HBT Monolithic Radio Transceiver with Tunable Filtering," IEEE Transactions on Microwave Theory and Techniques, 48(2):170–181, 2000.
J. Macedo et al., "A 2.5GHz Monolithic Silicon Image Reject Filter," IEEE 1996 Custom Integrated Circuits Conference, pp. 193–196, 1996.
B. Ray et al., "A Highly Linear Bipolar 1V Folded Cascode 1.9GHz Low Noise Amplifier," IEEE BCTM, pp. 157–160, 1999.

* cited by examiner

Primary Examiner—Robert Pascal
Assistant Examiner—Kimberly Glenn
(74) Attorney, Agent, or Firm—Gates & Cooper LLP (57) ABSTRACT

An integrated RF filter for use at microwave frequencies comprising: an integrated circuit inductor with connected integrated circuit capacitors, arranged as a tank circuit, and an integrated circuit shunt resistor; the inductor, capacitors and resistor being interconnected in a bridge-T filter arrangement.

7 Claims, 3 Drawing Sheets

FILTERS IMPLEMENTED IN INTEGRATED CIRCUITS

CROSS-REFERENCE TO RELATED APPLICATION

This application claims the benefit under 35 U.S.C. §119 (e) of and commonly-assigned Provisional Application Ser. No. 60/226,754, filed Aug. 21, 2000, by Tajinder Manku and Bish Ray, entitled "HIGHLY SELECTIVE PASSIVE BAND REJECT FILTER WITH LOW-Q LUMPED ELEMENTS IN A SI BIPOLAR PROCESS," attorneys' docket number 119.7-US-P1, which application is incorporated by reference herein.

BACKGROUND

The present invention relates generally to communications, and more specifically to improvements in Integrated Circuits for use in Radio Frequency/Microwave applications.

Many communication systems modulate electromagnetic signals from baseband to higher frequencies for transmission, and subsequently demodulate those high frequencies back to their original frequency band when they reach the receiver. The original (or baseband) signal, may be, for example: data, voice or video. These baseband signals may be produced by transducers such as microphones or video cameras, be computer generated, or transferred from an electronic storage device. In general, the high frequencies provide longer range and higher capacity channels than baseband signals, and because high frequency RF signals can effectively propagate through the air, they can be used for wireless transmissions as well as hard wired or fibre channels.

All of these signals are generally referred to as radio frequency (RF) signals, which are electromagnetic signals; that is, waveforms with electrical and magnetic properties within the electromagnetic spectrum normally associated with radio wave propagation. The electromagnetic spectrum was traditionally divided into 26 alphabetically designated bands, however, the International Telecommunication Union (ITU) formally recognizes 12 bands, from 30 Hz to 3000 GHz.

Wired communication systems which employ such modulation and demodulation techniques include computer communication systems such as local area networks (LANs), point-to-point communications, and wide area networks (WANs) such as the Internet. These networks generally communicate data signals over electrically conductive or optical fibre channels. Wireless communication systems which may employ modulation and demodulation include those for public broadcasting such as AM and FM radio, and UHF and VHF television. Private communication systems may include cellular telephone networks, personal paging devices, HF (high frequency) radio systems used by taxi services, microwave backbone networks, interconnected appliances under the Bluetooth standard, and satellite communications. Other wired and wireless systems which use RF modulation and demodulation would be known to those skilled in the art.

One of the current problems in the art is to develop filtering devices with the following characteristics:

physically small;

low power consumption;

inexpensive; and have good performance characteristics.

For cellular telephones, and similar consumer items, it is desirable to have transmitters and receivers (which may be referred to in combination as a transceiver) which can be fully integrated onto inexpensive, low power, integrated circuits (ICs).

The continuing desire to implement low-cost, power efficient receivers and transmitters has led to intensive research into the use of highly integrated designs, an increasingly important aspect for portable systems, including cellular telephone handsets. This has proven especially challenging as the frequencies of interest in the wireless telecommunications industry (especially low-power cellular/micro-cellular voice/data personal communications systems) have risen above those used previously (around 900 MHz) into the spectrum above 1 GHz.

Attempts at completely integrated transceiver designs in Radio Frequency Integrated Circuits (RF IC)—also known as monolithic microwave integrated circuits (MMIC)—have met with limited success. Most such transceiver topologies require at least two high quality filters that hitherto have not been economically integrated within any modern IC technology.

OTHER CONSIDERATIONS

Surface Acoustic Wave (SAW) filters are widely used as 'off-chip' filters—that is not integrated—in RF wireless terminals to provide filtering at RF to reduce the image band and at IF for channel selection. The SAW device is an electro-acoustic band-pass filter that operates via delay paths that conduct certain frequencies (pass-band), and cancel other frequencies (stop-band). An RF signal applied to the electrodes generates surface waves in a piezoelectric ceramic material. The amplitude and phase of the surface waves are functions of the distance between and overlap of the electrodes. The input to the filter is through a transducer, which generates a SAW in the piezoelectric substrate. This wave travels to the output transducer and produces a voltage output. Damping material (absorbers) direct and prevent scattering of the wave.

SAW filters introduce a higher insertion loss (attenuation through a filter, usually measured in decibels—typically measured at the centre frequency of a bandpass or notch filter) than do LC (inductor/capacitor) filters, so more gain is required in a given circuit to compensate for the loss. The use of off-chip components, even small efficient devices such as SAWs leads to increased cost in that the devices require interconnection via pins and leads which are significant contributors to the size, and hence cost, of highly integrated semiconductor devices. Manufacturers are expending considerable effort to reduce both the number of integrated packages and their pin-count within products for the personal communications market.

Passive LC filters implemented off-chip have similar disadvantages to SAW filters, and are largely not used on account of cost or performance for a given size. Active LC filters having suitable performance characteristics regarding bandwidth, and Q (Q is described in greater detail hereinafter) are available in monolithic-chip form. SAW and LC filters differ primarily in insertion loss (attenuation through a filter, usually measured in decibels—typically measured at the centre frequency of a bandpass or notch filter), attenuation characteristics (overall reduction of RF power through a device), and size. Various designs of LC filters have differing properties. For example, Butterworth filters provide excellent attenuation and maximally-flat passbands, but with non-linear phase, whereas Chebyshev filters provide excellent attenuation and equally distributed ripple, again with non-linear phase. Although monolithic techniques can shrink an LC filter to match the size of a SAW filter, a passive LC filter offers a worse attenuation figure and an active LC filter uses significant power.

Other off-chip filter types have been considered including:

Dielectric resonator filters; and

DSP filters;

but are not often implemented because of performance or power issues.

Although Gallium Arsenide (GaAs) based integrated circuit devices can be manufactured with the desired characteristics at the frequencies of interest, they are relatively more expensive, an important factor in the decision to use less expensive integrated circuit technologies based on silicon in low cost personal communications devices.

Finally, any additional requirement to drive an off-chip load adds another dimension to the already complicated overall system design trade-offs which must be made between noise, linearity, gain, and power consumption when selecting between on- and off-chip technologies.

SUMMARY

It is known and understood in the art that it is difficult to fabricate high-Q capacitors and inductors in high density radio frequency integrated circuit (RF IC) technologies based on silicon, especially those operating at frequencies exceeding 800 MHz. This difficulty has limited the ability of circuit designers to use these components in the fully integrated filter circuits needed to meet the demands of the personal communication industry, in terms of increasingly higher performance, lower costs and reduced power consumption. Furthermore, it is known and understood in the art that, although there are in general theoretical ways of improving the useful performance of such devices over limited ranges of bandwidth and frequency through the use of various combinations of those elements in collaboration with resistors, such improvements have not been feasible when applied to RF IC bipolar processes. This invention seeks to mitigate these disadvantages and others, as will be apparent from the following figures and description.

The invention provides a compact structure for a filter that can be integrated on-chip within the receiver/transmitter designs required for the personal communications and other cost-conscious industries.

The circuit structure of the invention uses integrated circuit elements to replace bulky external filters for use in a RF IC-based system such as a homodyne receiver, which is but one design of receiver widely-used in the wireless personal communication field.

The present invention provides an easy and low-cost method to form a notch filter, and to apply it in circuit designs using RF IC.

The invention introduces a circuit to replace bulky, external notch filters, using integrated elements in making RF IC design layouts. This is especially important for the design of RF IC used in the wireless personal communication field.

Limitations in the manufacturing techniques of relevant radio frequency integrated circuit (RFIC) semiconductor technologies have resulted in the infeasibity of producing fully integrated passive filters. The invention permits known circuits, previously unfeasible in the technology, to be implemented reliably and reproducibly in RF ICs working at higher frequencies. This invention represents an important advance in the race to improve the cost and performance of RF ICs used in the personal communications industry. The invention presents a novel implementation of circuitry working at frequencies exceeding those feasible in earlier products.

While conventional wisdom teaches that a satisfactory notch filter cannot be integrated, the invention implements a notch filter with the characteristics required, namely a Q in excess of 30, and low insertion loss, fully integrated with current silicon technology which offers on-chip inductors with typical Q's of about 8–15 at 1 GHz. The Q of the inductor is a function of the metal, thickness of metal, and the substrate in which the inductor is constructed with or on. Today's leading technologies use Al, Cu, or Ag as the inductor material. The integrated notch filter of the invention could also be implemented using other IC technologies which meet or exceed these criteria.

The invention implements a high-Q, narrow band, passive notch filter for use at frequencies exceeding 800 MHz, fabricated with metal-insulator-metal (MIM) on-chip capacitors and an on-chip inductor.

The invention is especially important in the personal communications industry (low-power, cellular/microcellular, voice/data) as the frequencies used have risen above 1 GHz.

As a demonstration of the technology, the invention has been implemented integrated into a low voltage folded cascode low noise amplifier (LNA) that has been realized with a Radio Frequency Integrated Circuit (RFIC) bipolar process. The process used was a 25 GHz Full Custom ASIC Bipolar process for RF and Broadband applications (NT25). Measurements show that the integrated low noise amplifier and filter topology maintain a relatively high measure of linearity, without sacrificing either noise figure or gain, and provide a sufficient degree of image frequency rejection. In addition, the total power consumption of the functional block remains unaltered, compared to a circuit using off-chip filters, and less than those implementations using on-chip active filters.

Typical image rejection ratios of 30 dB to 40 dB are achieved without the need for laser trimming, component selection, or other means of adjustment or trimming during the manufacturing stage. Simulations, confirmed with measured results, predict that the minimum image rejection will be Gain (LNA dB)+50 dB.

The invention has the advantage that the high-Q on-chip filtering does not use any active components (i.e. components that take power). Further, the invention provides this high-Q filtering ability using low-Q components integrated on-chip. The techniques used were formerly only implemented at lower frequencies, or with less highly integrated technologies.

It is therefore an object of the invention to provide a filter which obviates or mitigates at least one of the disadvantages of the prior art.

One aspect of the invention is broadly defined as an integrated RF filter for use at microwave frequencies comprising: an integrated circuit inductor with connected integrated circuit capacitors, arranged as a tank circuit, and an integrated circuit shunt resistor; the inductor, capacitors and resistor being interconnected in a bridge-T filter arrangement.

Another aspect of the invention is defined as an integrated RF filter for use at microwave frequencies comprising: first and second capacitors connected in series between an input and an output of said filter; an inductor, connected between the input and the output of the filter, in parallel to the series connected capacitors; and a shunt resistor connected between ground, and the common side of said first and second capacitors.

FIGURES

The invention will now be described with reference to the following figures.

DETAILED DESCRIPTION

This invention introduces a high-Q narrow-band, passive (notch) filter for use at frequencies exceeding 800 MHz, fabricated with metal-insulator-metal (MIM) capacitors and an on-chip inductor with a Q factor of approximately 3–10, implemented on a conductive silicon substrate. Typically, a single filter module implemented according to this invention provides approximately 50 dB of rejection at 2.4 GHz with a 2% bandwidth.

Figure 1:
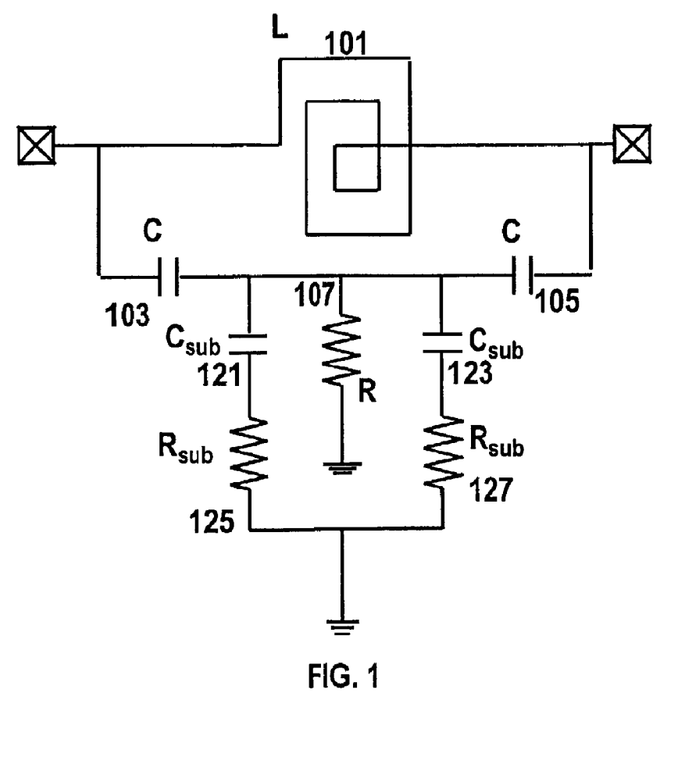
FIG. 1 is a circuit diagram of a filter in the preferred embodiment of the invention.
Figure 2:
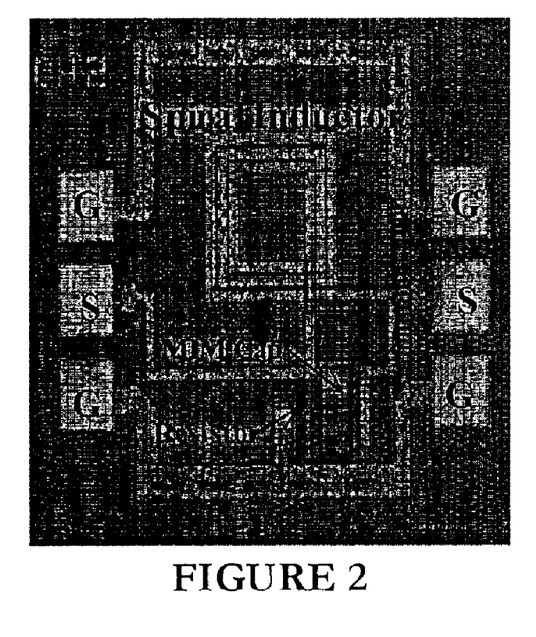
FIG. 2 is a die photo of the complete structure of a filter which illustrates one possible physical implementation of the invention in a relevant technology.

Referring first to FIG. 1, the invention consists of an on-chip inductor L 101, capacitors C 103, 105, and resistor R 107. The inductor 101 and the capacitors 103, 105 can have low Q values (e.g. ~3). Also shown are the various parasitic components that are associated with the layout of the MIM capacitors 103, 105. These parasitic components, $C_{sub}$ 121, 123 and $R_{sub}$ 125, 127, affect the actual notch frequency of the circuit as explained later. All of these components are implemented as integrated components in a silicon-based RF integrated circuit technology. FIG. 2 is a die photo of the complete structure of the circuit, with the major circuit elements identified as per the circuit diagram of FIG. 1.

It is well known and understood in the art that the notch depth of a conventional shunt connected LC band reject filter implemented on an RF IC is limited by the poor Q-factor of the inductor and capacitors used in the circuit and typically provides 20 dB of rejection. By designing and selecting the resistance R of the shunt resistor R 107 so that it equals the magnitude of the resonant resistance $R_r$ of the inductor L 101, the notch filter in this design can theoretically achieve an infinite notch depth. Even under the imperfect conditions caused by mismatched components and other circuit imperfections the present topology can easily achieve 40 dB of rejection, which is sufficient for many applications.

Although the basic invention can be implemented within a known circuit or between two known circuits to achieve high Q the benefits of the invention are most apparent when it is implemented within a single-chip design, eliminating the extra cost of interconnecting semiconductor integrated circuit devices, reducing the overall power consumption, and obviating the need to drive off-chip impedances which may not accurately match those of the driving devices.

In a further embodiment of the invention, variable tuning of the resonant frequency of the circuit is effected by varying the capacitance C 103, 105 in the circuit, thereby permitting some degree of flexibility of the design after manufacture and allowing parameters to be varied during use depending on the requirements, in a multi-band/multi-mode receiver for example. One method of achieving this variation is by using varactor diodes instead of Metal-Insulator-Metal (MIM) capacitors. Other appropriate technologies might also be used.

The following circuit analysis is included for information.

Circuit Analysis

Figure 3:
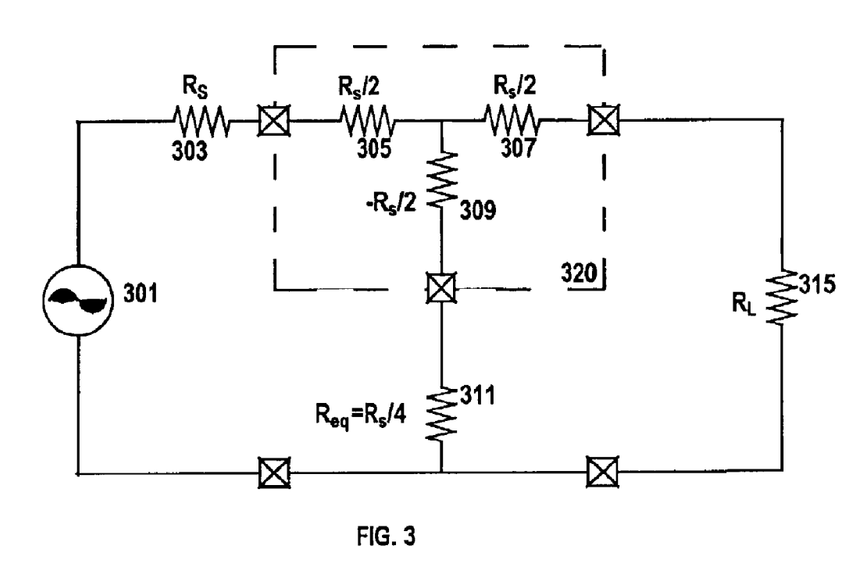
FIG. 3 shows the equivalent circuit for a bridge-T network at resonance.

Referring now to FIG. 3, which shows the equivalent circuit at resonance, of a notch filter implemented according to the invention, assuming that the capacitors are loss-less, and ignoring other parasitic components. The components comprising the equivalent resistance of the capacitors 309 and inductor 305, 307 are shown 320, together with an exemplar signal source, comprising a perfect generator 301 and its source impedance $R_S$ 303 and exemplar signal load $R_L$ 315. Also shown is the resistor 311 having a value equal to the combined equivalent resistance of the inductor/capacitor filter circuit as seen by the source and load.

The figure of merit $Q_L$, or quality factor, of an inductor is the ratio of the component's reactance $X_L$, at a given frequency, to its equivalent series resistance $R_S$, and is given mathematically by $$Q_L = \frac{X_L}{R_S} \qquad (1)$$

The resistance of a parallel LC network has a finite value at resonance since on-chip inductors have finite Quality factors ($Q_L$). The equivalent resistance at resonance for an LC tank circuit is given by:

$$R_R = R_S(1+Q_L^2) \qquad (2)$$

where $Q_L$ is the quality factor of the inductor, $R_S$ represents the series resistance of the inductor and $R_R$ denotes the resistance of the parallel LC tank circuit near resonance.

A bridge-T network can be realized as a parallel combination of a T-network and a series impedance. The T-network in this topology consists of capacitance with a shunt resistance. Series impedance has been realized with an inductance. The admittance matrix for this reciprocal structure is represented by:

$$Y = \begin{bmatrix} Y_{11} & Y_{12} \\ Y_{21} & Y_{22} \end{bmatrix} \qquad (3)$$

where $$Y_{11} = Y_{22} = \frac{\left[\frac{1}{j \cdot \omega \cdot C} + R\right]}{\frac{2 \cdot R}{j \cdot \omega \cdot C} - \frac{1}{(\omega \cdot C)^2}} + \frac{1}{(R_s + j \cdot \omega \cdot L)^2} \qquad (4)$$

and $$Y_{12} = Y_{21} = \frac{-R}{\frac{2 \cdot R}{j \cdot \omega \cdot C} - \frac{1}{(\omega \cdot C)^2}} - \frac{1}{(R_s + j \cdot \omega \cdot L)} \qquad (5)$$

At resonance both the real and imaginary parts of the impedance approach zero. In designing a bridge-T filter it is important to adjust the equivalent shunt resistance $R_{EQ}$ to be equal to, or close to, the resonant resistance $R_S$ of the tank inductor. Under ideal resonance conditions, a notch of infinite depth occurs if $R_{EQ}-R_S=0$. However, in a real implementation of an integrated circuit filter the notch depth is limited by the additional ground path inductance associated with the interconnection of resistor $R_{EQ}$ to the ground. The parasitic substrate capacitance and resistance associated with the layout of the Metal-Insulator-Metal (MIM) capacitor is also a factor in determining the exact notch frequency. At frequencies removed from resonance, the filter equivalent impedance is either capacitive or inductive, and the insertion loss therefore varies with frequency.

Measurements show that a typical maximum rejection obtained from an integrated bridge-T filter, implemented according to this invention, is 48 dB, compared with 17 dB for the case where R=0, which corresponds to a simple band reject LC circuit not taking advantage of the invention. This additional rejection is achieved at the expense of a small increase in path loss, somewhat easily overcome if necessary by increases in gain introduced earlier in the system. Cascading similar filter modules can be used to provide additional rejection.

Other measurements of a circuit implemented according to the invention have been compared with simulations of like designs and show that for typical (real) Q factors, for inductors having values in the range 0.5 nH to 7.0 nH, the impedance characteristics, as well as the 30 dB bandwidths, and 3 dB/30 dB shape factors, show reasonable correlation, any differences being explainable by various parasitic effects.

CONCLUSION

The invention is applicable to those semiconductor technologies that permit the fabrication of on-chip inductors. Although frequently termed 'spiral', the actual shape or configuration of the inductive component is not critical, and other topographies including a transmission line or hairpin shape may be used.

Those skilled in the art will also understand that the integrated circuit technology might be other than silicon, and that a similar technique can be used to extend the use of effective filters into higher frequencies than was feasible or practicable for those other technologies before the application of this invention. It is therefore the intent of the inventors to include integrated circuit technologies other than silicon, and higher frequency applications within the scope of this invention.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

Although the invention has been described in a particular implementation of a receiver, those skilled in the art will recognise that the invention is applicable in any highly integrated semiconductor technology requiring filtering of signals, particularly, but not limited to, those frequencies exceeding 800 MHz, in situations where overall system power efficiency, filter performance, and overall size of the final system are significant factors, and where, hitherto, such filters have been unfeasible.

The filter of the invention, for example, may be applied to wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, it is clear that changes and modifications may be made to such embodiments without departing from the true scope and spirit of the invention.

What is claimed is:

1. An integrated RF filter for use at microwave frequencies comprising:

first and second capacitors connected in series between an input end an output of said filter;

an inductor, connected between said input and said output of said filter, in parallel to said series connected capacitors, said first and second capacitors and said inductor comprising a tank circuit; and a shunt resistor connected between ground, and the common side of said first and second capacitors;

each of said inductor, capacitors and resistor being a low-Q integrated element, yet wherein said integrated RF filter circuit results in a high-Q passive filter at microwave frequencies; and wherein the value of said shunt resistor is selected to be equal in magnitude to the impedance of said inductor and capacitor tank circuit at its resonant frequency.

2. The integrated RF filter of claim 1, implemented in a silicon technology.

3. The integrated RF filter of claim 2, wherein said silicon technology comprises silicon bipolar technology.

4. The integrated RF filter of claim 2, wherein said capacitors are implemented as variable capacitors, thereby permitting a degree of tuning of the filter frequency of the circuit during use.

5. The integrated RF filter of claim 4 wherein said variable capacitors are implemented using varactor diodes.

6. The integrated RF filter of claim 2, wherein the centra of the operating frequency band of said integrated RF filter exceeds 800 MHz.

7. The integrated RF filter of claim 1, wherein the values of each of said inductor, capacitors and resistor are selected to provide a narrow band notch filter.

* * * * *

UNITED STATES PATENT AND TRADEMARK OFFICE
CERTIFICATE OF CORRECTION

PATENT NO. : 6,867,665 B2 Page 1 of 5
APPLICATION NO. : 09/934339
DATED : March 15, 2005
INVENTOR(S) : Manku et al.

It is certified that error appears in the above-identified patent and that said Letters Patent is hereby corrected as shown below:

<u>Column 8</u>
Line 26, "end" should read --and--.
Line 50, "centra" should read --center--.

THE TILTE PAGE, SHOWING AN ILLUSTRATIVE FIGURE, SHOULD BE DELETED AND SUBSTITUTE THEREFOR THE ATTACHED TITLE PAGE.

DELTE DRAWING SHEETS 1-3, AND SUBSTITUTE THEREFOR THE DRWAING SHEETS CONSISTIN OF FIGS 1-3 AS SHOWN ON THE ATTACHED PAGES.

Signed and Sealed this

Third Day of April, 2007

JON W. DUDAS
*Director of the United States Patent and Trademark Office*

United States Patent
Manku et al.

(10) Patent No.: US 6,867,665 B2
(45) Date of Patent: Mar. 15, 2005

(54) FILTERS IMPLEMENTED IN INTEGRATED CIRCUITS

(75) Inventors: Tajinder Manku, Kitchener (CA); Bish Ray, Kanata (CA)

(73) Assignee: Sirific Wireless Corporation, Waterloo (CA)

(*) Notice: Subject to any disclaimer, the term of this patent is extended or adjusted under 35 U.S.C. 154(b) by 0 days.

(21) Appl. No.: 09/934,339

(22) Filed: Aug. 21, 2001

(65) Prior Publication Data

US 2002/0047757 A1 Apr. 25, 2002

Related U.S. Application Data

(60) Provisional application No. 60/226,754, filed on Aug. 21, 2000.

(51) Int. Cl.$^7$ .................................................. H03H 7/00
(52) U.S. Cl. .......................... 333/171; 333/172; 333/176
(58) Field of Search .................................. 333/170, 171, 333/172, 174–176

(56) References Cited

U.S. PATENT DOCUMENTS

| | | | | |
|---|---|---|---|---|
| 2,093,665 A | * | 9/1937 | Tellegen | 333/170 |
| 2,207,796 A | * | 7/1940 | Grundmann | 333/171 |
| 2,606,966 A | * | 8/1952 | Pawley | 333/170 |
| 3,325,753 A | * | 6/1967 | Shearer et al. | 333/170 |
| 3,898,375 A | * | 8/1975 | Hannan et al. | 380/208 |
| 5,105,172 A | * | 4/1992 | Khatibzadeh et al. | 333/175 |
| 5,121,078 A | * | 6/1992 | Havot et al. | 333/170 |
| 5,202,651 A | | 4/1993 | Yoshimasu | 333/170 |
| 5,635,892 A | * | 6/1997 | Ashby et al. | 336/200 |
| 5,697,087 A | | 12/1997 | Miya et al. | 455/307 |
| 5,918,167 A | | 6/1999 | Tiller et al. | 455/310 |
| 6,606,012 B2 | * | 8/2003 | Novak | 333/17.3 |

FOREIGN PATENT DOCUMENTS

GB   0841560   * 7/1960   .............. 333/170

OTHER PUBLICATIONS

Millman, Microelectronics: Digital and Analog Circuits and Systems, McGraw-Hill Book Co., p. xxii, 1979.*
M.A. Copeland et al., "5-GHz SiGe HBT Monolithic Radio Transceiver with Tunable Filtering," IEEE Transactions on Microwave Theory and Techniques, 48(2):170–181, 2000.
J. Macedo et al., "A 2.5GHz Monolithic Silicon Image Reject Filter," IEEE 1996 Custom Integrated Circuits Conference, pp. 193–196, 1996.
B. Ray et al., "A Highly Linear Bipolar 1V Folded Cascode 1.9GHz Low Noise Amplifier," IEEE BCTM, pp. 157–160, 1999.

* cited by examiner

*Primary Examiner*—Robert Pascal
*Assistant Examiner*—Kimberly Glenn
(74) *Attorney, Agent, or Firm*—Gates & Cooper LLP (57) ABSTRACT

An integrated RF filter for use at microwave frequencies comprising: an integrated circuit inductor with connected integrated circuit capacitors, arranged as a tank circuit, and an integrated circuit shunt resistor; the inductor, capacitors and resistor being interconnected in a bridge-T filter arrangement.

7 Claims, 3 Drawing Sheets